United States Patent
Fukatsu et al.

[11] Patent Number: 5,558,074
[45] Date of Patent: Sep. 24, 1996

[54] IGNITION DEVICE FOR INTERNAL-COMBUSTION ENGINE

[75] Inventors: Katsuaki Fukatsu, Urizura-machi; Noboru Sugiura, Mito; Hayato Koguchi, Takahagi; Yoichi Anzo, Hitachinaka, all of Japan

[73] Assignee: Hitachi, Ltd., Tokyo, Japan

[21] Appl. No.: 508,703

[22] Filed: Jul. 28, 1995

[30] Foreign Application Priority Data

Jul. 28, 1994 [JP] Japan ................................ 6-177277
Jul. 28, 1994 [JP] Japan ................................ 6-177278

[51] Int. Cl.⁶ ........................................ F02P 3/00
[52] U.S. Cl. ........................................ 123/647
[58] Field of Search ................................ 123/647, 665, 123/652, 634, 633, 635, 192 B, 425, 435, 421, 198 R; 361/748, 263, 253, 247, 248, 382, 392, 388; 73/35; 439/527

[56] References Cited

U.S. PATENT DOCUMENTS

| | | | |
|---|---|---|---|
| 4,766,869 | 8/1988 | De Concini et al. | 123/647 |
| 5,044,328 | 9/1991 | Umezaki | 123/647 |
| 5,136,998 | 8/1992 | Deutsch | 123/421 |
| 5,159,532 | 10/1992 | Kilian et al. | 361/388 |
| 5,295,861 | 3/1994 | Peretick et al. | 439/527 |
| 5,296,999 | 3/1994 | Taruya | 361/247 |
| 5,313,927 | 5/1994 | Takaishi | 123/634 |
| 5,463,999 | 11/1995 | Taruya et al. | 123/647 |

*Primary Examiner*—Raymond A. Nelli
*Attorney, Agent, or Firm*—Evenson, McKeown, Edwards & Lenahan, P.L.L.C.

[57] ABSTRACT

An ignition device for an internal-combustion engine, in which a pocket section is provided in a case for holding primary and secondary coils, and an ignition module is built in the pocket section. In the ignition module a relay member is secured on a heat sink, a connecting terminal electrically connected to an internal terminal is installed to the relay member, and the connecting terminal and a hybrid IC substrate are electrically connected by an aluminum wire.

7 Claims, 12 Drawing Sheets

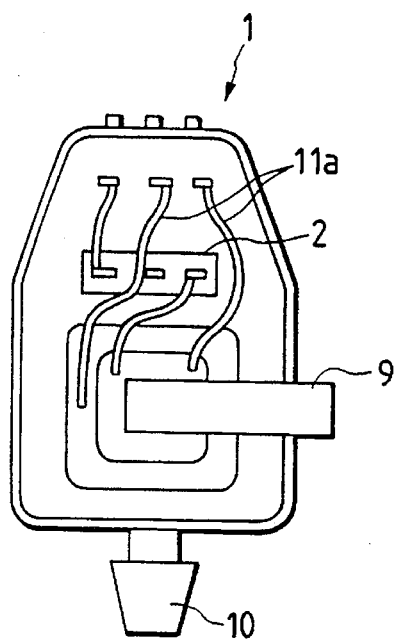
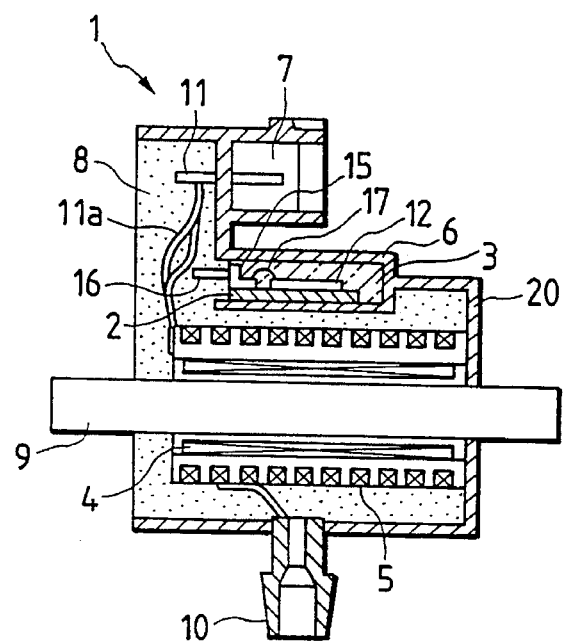
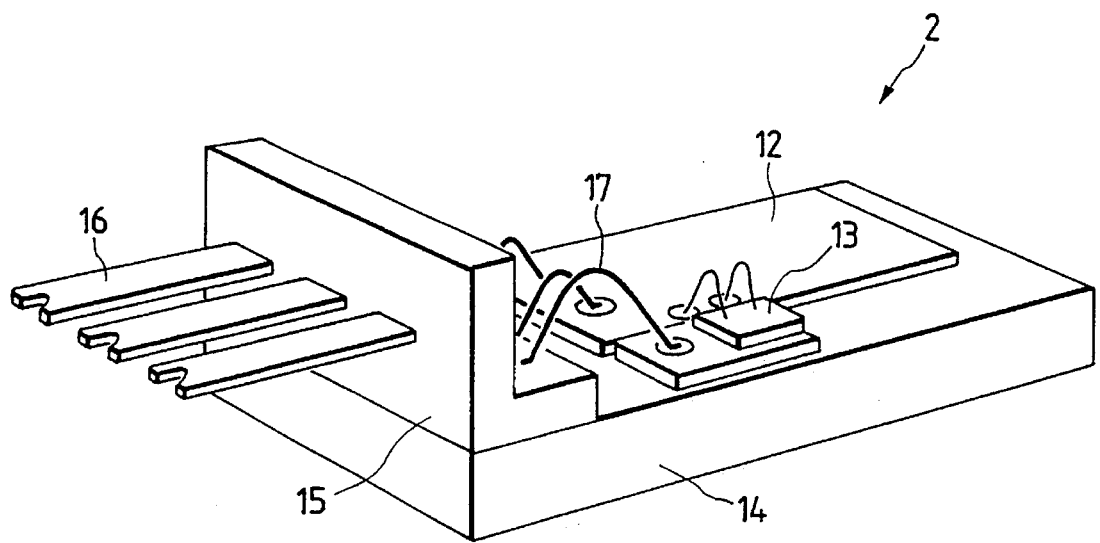

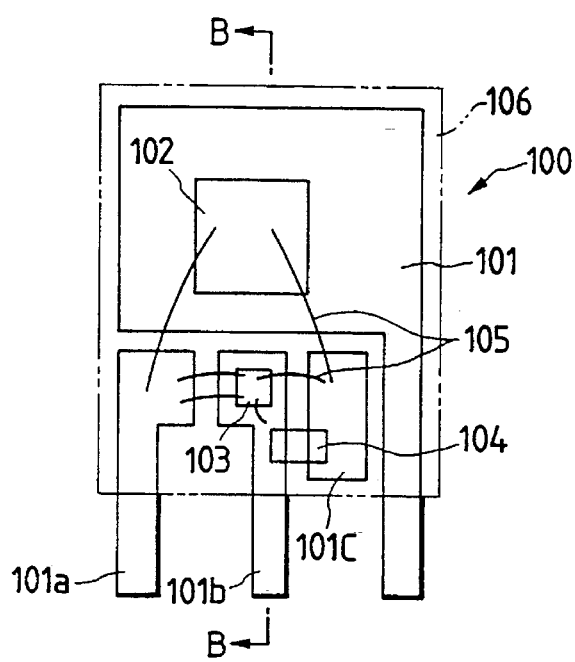
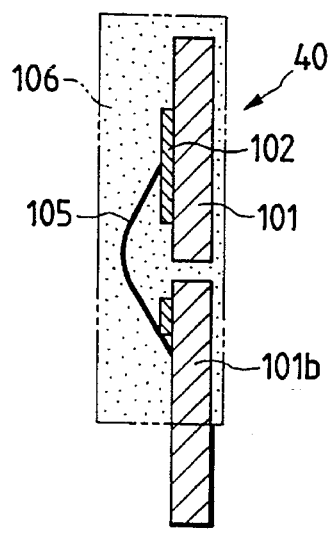
FIG. 3(a)　　　FIG. 3(b)
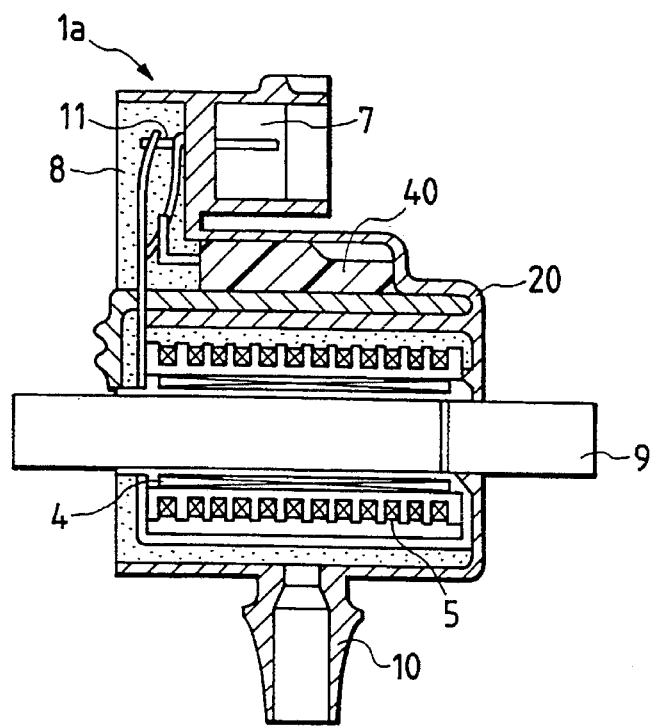
FIG. 4

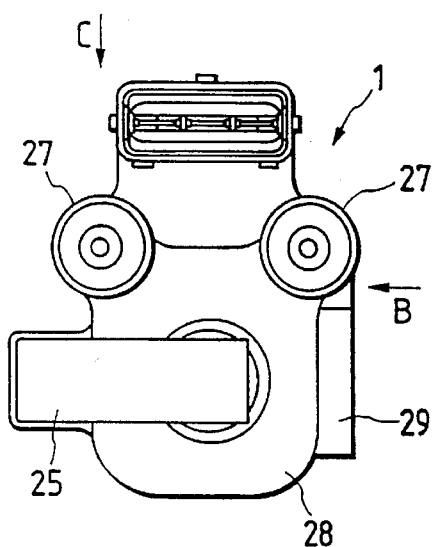
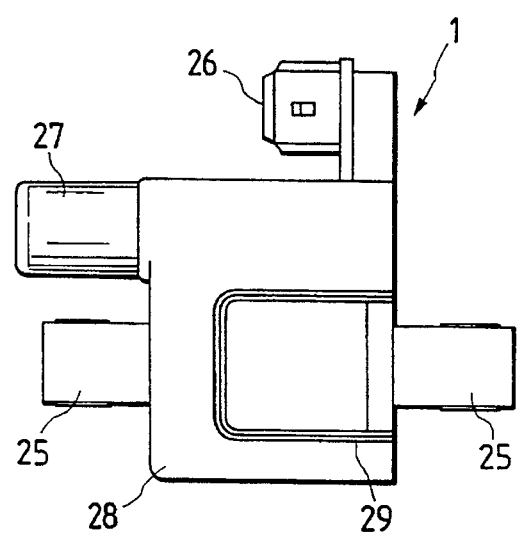
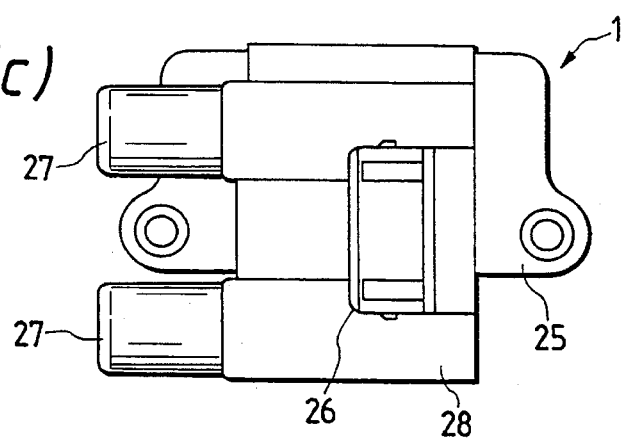
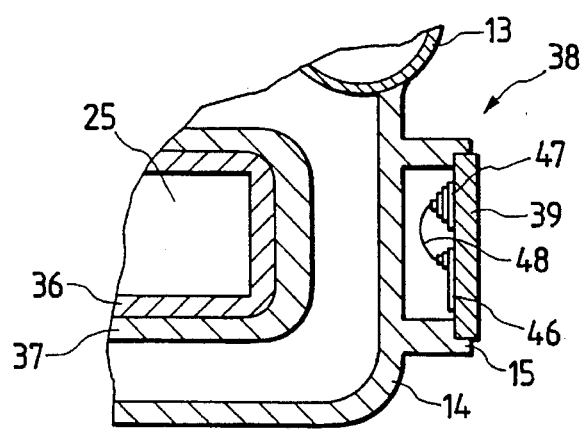

FIG. 19(a)
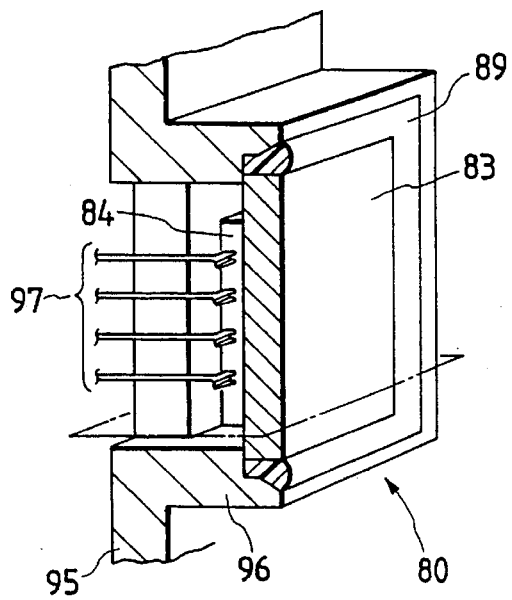
FIG. 19(b)
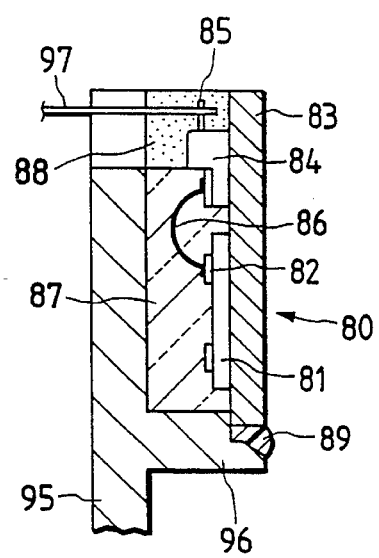
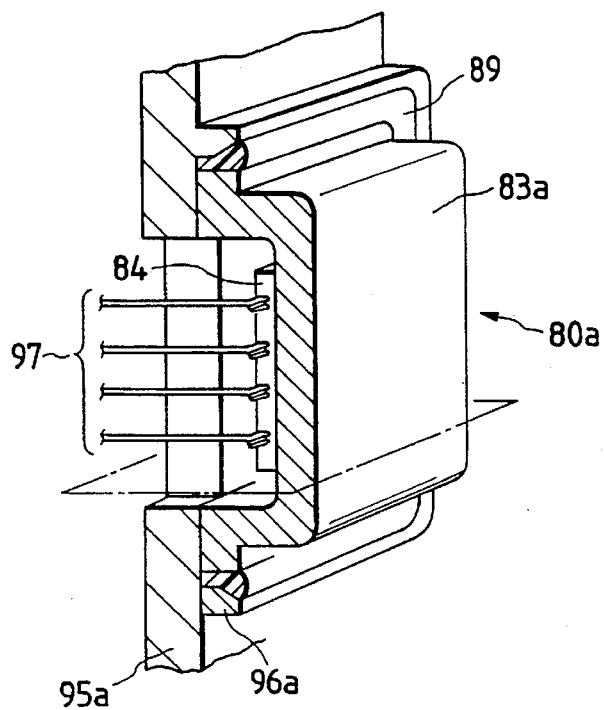
FIG. 20(a)
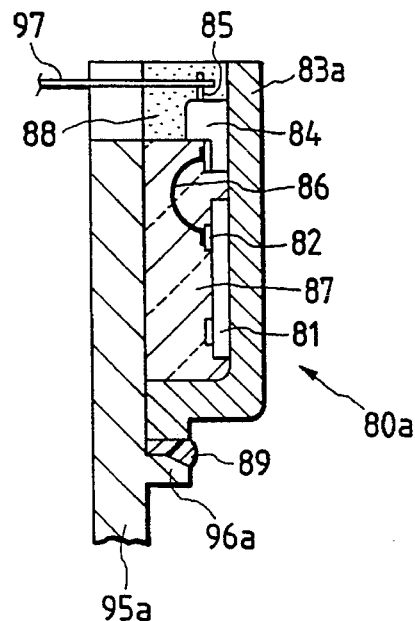
FIG. 20(b)

IGNITION DEVICE FOR INTERNAL-COMBUSTION ENGINE

BACKGROUND OF THE INVENTION

1. Field of the Invention

The present invention relates to an ignition device for an internal-combustion engine with a built-in ignition module in which an ignition coil is assembled integrally with an ignition module for interrupting the supply of the primary current of the ignition coil.

2. Description of the Related Art

An ignition device for an internal-combustion engine with an ignition module built in a pocket section provided within a case for holding an ignition coil has been disclosed in Japanese Patent Laid-Open No. Hei 4-59116. In this ignition device for an internal-combustion engine, an IC package body with a circuit section such as a hybrid IC solidly sealed with a thermosetting resin is built in the case holding the ignition coil. From a terminal of the hybrid IC, a wire is led out through resin forming the IC package body and is electrically connected to a terminal provided in the ignition coil.

The IC package body described above is such as one with a power transistor mounted on a lead frame serving also as a heat sink which dissipates heat, one with an IC chip, etc. for control mounted on another lead frame, and one with wire for electrical connection thereof solidly sealed with a thermosetting resin. However, the IC package body stated above has no versatility; that is, one type of IC package body is not usable for various purposes, and therefore a special IC package body is needed for each type of ignition coil. In the meantime, because a large-scale manufacturing equipment is required for the solid sealing of wire described above, it becomes necessary to manufacture the same type of IC package bodies in a very large number, otherwise it will become very expensive. That is, if many types of special IC package bodies are manufactured each type in small quantities, the IC package bodies will become comparatively high in cost.

Furthermore, when a hybrid IC substrate is used from the necessity of a higher-accuracy multifunction circuit, the aforesaid full sealing with resin can deteriorate wire connections of parts mounted on the substrate due to repetition of initial stress and thermal stress, and therefore no substantial reliability of circuit connections can be obtained.

SUMMARY OF THE INVENTION

It is therefore an object of the present invention to provide an ignition device for an internal-combustion engine which is provided with an ignition coil and an ignition module which are assembled as a unit; the ignition module, being simple in construction, can be manufactured at a moderate cost while its reliability is ensured.

To accomplish the above-described object, according to the present invention, in the ignition device for an internal-combustion engine which is provided with an ignition module having an IC section for interrupting the supply of the primary current of the ignition coil and assembled integrally with the ignition coil, the ignition module has a heat sink which dissipates heat generated at the IC section, a relay member secured on the heat sink, a connecting terminal fitted on the relay member for electrical connection to terminal in the ignition coil, and wire for electrically connecting the connecting terminal to the IC section.

In the ignition device for an internal-combustion engine described above, the ignition module is preferably mounted in a pocket section provided in a case for holding the ignition coil, and a silicone gel agent is filled in a space on the IC section side of the relay member in the pocket section, while a thermosetting synthetic resin for ignition coil insulation is filled in the remaining part of the space in the pocket section.

In the ignition device for an internal-combustion engine, it is preferable to use an aluminum bonding wire for a wire to be used for electrical connection of the connecting terminal to the IC section.

Furthermore, a thermosetting synthetic resin is preferably used as the material of the relay member.

In the ignition module of the present invention of the above-described constitution, securely mounting the relay member on the heat sink, mounting the connecting terminal electrically connected to the terminal in the ignition coil on the relay section, and electrically connecting by a wire the connecting terminal to the IC section, make it unnecessary to solidly seal such component members of the ignition module as the heat sink, IC section and wire with the thermosetting resin. Therefore, the manufacturing equipment for solid sealing may be dispensed with, and moreover no special IC package body is needed even when the constitution of the ignition module varies correspondingly to the type of ignition coil, thus enabling the manufacture of inexpensive ignition modules of simple construction. Furthermore, since the thermosetting resin for solid sealing will not contact any component member of the ignition module, the wire connection on the IC section will not be deteriorated with the repetition of initial stress and thermal stress, thus insuring reliable connection of circuits.

Furthermore, since a pocket section is provided in a case for holding the ignition coil, the ignition module is built in the pocket section, and the silicone gel agent is filled in the space on the IC section side of the relay member in the pocket section, the IC section and wires for electrical connection are protected to thereby enhance their vibration resistance. Further, an insulating casting resin to be impregnated to the ignition coil is filled in the remaining space in the pocket section. At this time, the insulating casting resin is prevented from entering the space where the IC section and the wire for electrical connection are present, by the silicone gel agent filled in the space on the IC section side of the relay member, thereby protecting this area.

Furthermore, epoxy resin most suitable for use as the insulating casting resin differs from the silicone gel agent in such properties as hardness and thermal expansion coefficient; therefore should the wire be arranged in a boundary therebetween, the wire could be broken with heat and external stress, making it difficult to ensure reliability. In the present invention, the relay member is disposed between the insulating casting resin and the silicone gel agent and the connecting terminal is attached to the relay member, so that the wire for electrical connection of the connecting terminal to the IC section will be arranged only in the silicone gel agent. Therefore, there will never occur such a trouble that the wire will be broken due to a difference in properties between the insulating casting resin such as epoxy resin and the silicone gel agent when exposed to heat or an external stress. Furthermore, since the external stress is applied only to the connecting terminal, the wiring connection on the IC section will not be stressed directly from outside. It is therefore possible to ensure the reliability of the circuit connection.

Furthermore, an aluminum bonding wire, when used for electrical connection between the connecting terminal and the IC section, can absorb a thermal stress generated by a difference in thermal expansion coefficient of the relay member and the IC section, ensuring a construction which will not yield to the thermal stress.

BRIEF DESCRIPTION OF THE DRAWINGS

The above and other objects, features and advantages of the present invention will become more apparent from the following description of the invention taken in conjunction with the accompanying drawings, wherein:

FIG. 1 is a view showing one embodiment of the constitution of an ignition device for an internal-combustion engine according to the present invention, wherein (a) is a front view and (b) is a sectional view;

FIG. 2 is a view showing the constitution of an ignition module in the ignition device for an internal-combustion engine of FIG. 1;

FIG. 3 is a view showing one example of the constitution of an IC package body used in a prior art ignition device with a built-in ignition module for an internal-combustion engine, wherein (a) is a plan view thereof, and (b) is a sectional view taken along line B—B of (a);

FIG. 4 is a sectional view showing the constitution of the ignition device for internal-combustion engines, which includes the IC package body of FIG. 3 built in a case for holding an ignition coil;

FIG. 5 is a view showing the outside appearance of a second embodiment of the ignition device of simultaneous ignition system for the internal-combustion engine according to the present invention, wherein (a) is a front view thereof, (b) is a side view taken in the direction of B in (a), and (c) is a plan view taken in the direction of C in (a);

FIG. 6 is a partly sectional view in the vicinity of a mounting section 15 in FIG. 2 (a);

FIG. 19 is a view showing a third embodiment of the constitution of the ignition module of the ignition device for an internal-combustion engine according to the present invention, wherein (a) is a partly sectioned bird's-eye view and (b) is a sectional view taken along line B—B of (a); and FIG. 20 is a view showing a fourth embodiment of the constitution of the ignition module of the ignition device for an internal-combustion engine, wherein (a) is a partly sectioned bird—s-eye view and (b) is a sectional view taken along line B—B of (b).

DETAILED DESCRIPTION OF THE PREFERRED EMBODIMENTS

Figure 7:
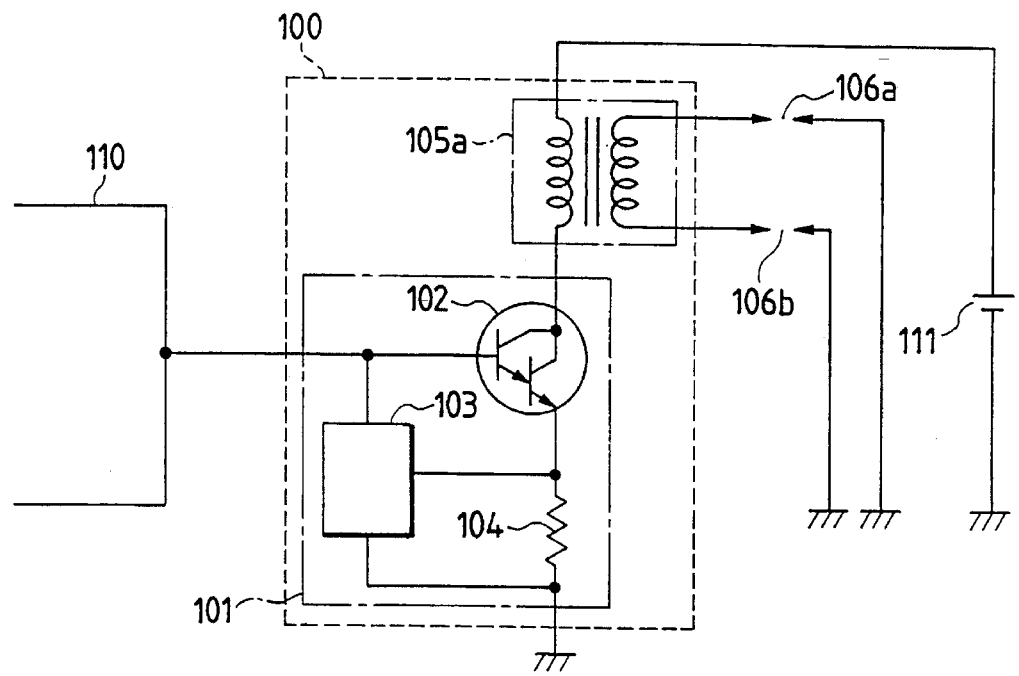
FIG. 7 is a block diagram of a basic electronic distribution system for general use for the ignition device for internal-combustion engines in FIG. 5, and particularly a block diagram of an electronic distribution system for the ignition device of simultaneous ignition system for the internal-combustion engine.

One embodiment of an ignition device for an internal-combustion engine according to the present invention will be explained with reference to FIGS. 1 to 4.

First, the constitution of the ignition device for an internal-combustion engine of the present embodiment will be described by referring to FIG. 1.

The ignition system 1 for an internal-combustion engine of the present embodiment (hereinafter referred to as the ignition device) is a direct ignition coil with a built-in ignition module directly mounted above a spark plug of each cylinder. The ignition device 1 is provided with a primary coil 4 and a secondary coil 5 which are major parts of the ignition coil, a connector section 7 for connection with external devices, an insulating casting resin 8 for insulating the primary coil 4 and the secondary coil 5, a laminated core 9 inserted in the primary coil 4 and the secondary coil 5, a high-voltage tower 10 which outputs a secondary voltage of the secondary coil 5, an internal terminal 11 connected to the connector section 7, and a case 20 for holding these members. The above constitution is similar to that of the ignition device having no built-in ignition module. In addition to the above-described constitution, the present embodiment has a pocket section 6 in the case 20 and an ignition module 2 built in the pocket section 6.

Next, the constitution of the ignition module 2 of the ignition device for internal-combustion engines of the present embodiment will be explained by referring to FIG. 2.

The ignition module 2 includes a hybrid IC substrate 12 on which a current limit circuit, etc. are formed, a power transistor 13 for opening and closing the current circuit to the primary coil 4, a heat sink 14 for dissipating heat generated at the power transistor 13, a relay member 15 produced of a thermosetting resin such as PBT (polyethylene terephthalate) fixedly mounted on the heat sink 14, a connecting terminal 16 mounted on the relay member 15, and a wire of an aluminum system 17 (hereinafter called the aluminum wire) for connection between the hybrid IC substrate 12 and the connecting terminal 16.

A procedure for mounting the ignition module 2 into the pocket section 6 of the case 20 as described above will be explained. First, the ignition module 2 is inserted and fixed in the pocket section 6 by using an adhesive applied on the back side of the heat sink 14 of the ignition module 2 or by using a projection formed within the pocket section 6 by which the heat sink 14 can be installed and removed. Subsequently, the silicone gel 3 (see FIG. 1) is filled into the pocket section 6 for the purpose of protecting the hybrid IC substrate 12 and improving vibration resistance. At this time, the silicone gel 3 must be filled in at least from the relay member 15 to the space on the hybrid IC substrate 12 side. A soft epoxy resin may be used instead of the silicone gel 3. Thereafter, using a lead wire 11a, connection is made between the connecting terminal 16 and the terminal of the primary coil 4, between the connecting terminal 16 and the internal terminal 11, and between the terminal of the primary coil 4 and the internal terminal 11. Next, the insulating casting resin 8 which is a thermosetting synthetic resin such as epoxy resin is filled in the case 20, and then is heated for setting, thereby insulating the primary coil 4 and the secondary coil 5. At this time, the insulating casting resin 8 is filled also in the remaining space of the pocket section 6 in which the silicone gel 3 has not been filled yet, that is, in the space located on the opposite side of the hybrid IC substrate 12 as viewed from the relay member 15.

Next, an ignition device for a conventional built-in ignition module type internal-combustion engine will be explained by referring to FIGS. 3 and 4.

FIG. 3 is a view showing one example of the constitution of an IC package body 100 fixedly sealed with resin which is used in the ignition system of the conventional built-in ignition module type internal-combustion engine. As shown in FIG. 3, the IC package body 100 includes a power transistor 102 mounted on a lead frame 101 which is used also for the heat sink, a control IC chip 103 and a current detecting resistor 104 each mounted on other lead frames 101a to 101c, and a wire 105 for electrically connecting these parts which is fixedly sealed with a thermosetting resin 106. In FIG. 3, however, the contour of the resin 106 applied is indicated for brevity with an imaginary line (alternate long and two short dashes line). FIG. 4 is a view showing an ignition device 1a in which the IC package body 100 fixedly sealed with the resin 106 as described above is built in the case for holding the ignition coil. It should be noted, however, that the same members as those in FIG. 1 are designated by the same reference numerals.

The IC package body 100 has no versatility as previously stated and therefore a special IC package body 100 is required for each type of ignition coil. That is, one type of IC package body 100 is not applicable to plural types of ignition coils. In the meantime, since a large-scale manufacturing equipment is required for the aforementioned solid sealing, it is necessary to produce the same type of IC package bodies 100 voluminously, otherwise the manufacturing equipment will become unprofitable. In the case many types of special IC package bodies 100 are manufactured each in small quantities, each product will become relatively very costly. Furthermore, since the use of a higher-accuracy multifunctional circuit is demanded, wire connections of parts mounted on the hybrid IC substrate can be deteriorated with repetitive application of the initial stress and thermal stress provided that the resin 106 is used to fully seal the IC package body 100 when the hybrid IC substrate is used in the IC package body 100, resulting in lowered reliability of circuit connection.

In the meantime, in the present invention the relay member 15 is secured on the heat sink 14, the connecting terminal 16 is mounted on the relay member 15, and the connecting terminal 16 and the hybrid IC substrate 12 are electrically connected by the aluminum wire 17, thereby making it unnecessary to solidly seal each part with the thermosetting resin 106 as shown in FIG. 3. Consequently the solid sealing manufacturing equipment can be dispensed with, and accordingly no special IC package body is required even when the constitution of the ignition module 2 differs from the type of the ignition device 1, allowing the manufacture of an inexpensive ignition module 2 of simple construction. Furthermore, because the thermosetting resin will not contact the component members of the ignition module 2, the wire connections of parts mounted on the hybrid IC substrate 12 will not be deteriorated with repetitive application of the initial stress and thermal stress, insuring the reliability of the circuit connection.

Since the silicone gel 3 is filled in the space in the pocket section 6 in which the hybrid IC substrate 12 with the electronic circuit formed thereon and the parts and the aluminum wire 17 mounted on the hybrid IC substrate 12 are present, each part in the space is protected and improved in vibration resistance. Furthermore, with the filling of the silicone gel 3, the insulating casting resin 8 for insulating the primary coil 4 and the secondary coil 5 is prevented from entering the space on the hybrid IC substrate 12 side, thus protecting the section.

Furthermore, since the relay member 15 mounted with the connecting terminal 16 is located between the insulating casting resin 8 and the silicone gel 3, the aluminum wire 17 is disposed only in the silicone gel 3. Therefore, the aluminum wire 17 will not be broken despite of a difference in characteristics between the insulating casting resin 8 and the silicone gel 3 even when applied with heat and an external stress. Furthermore, an external stress, being added only to the connecting terminal 16, will not directly act on the connection of the aluminum wire 17 on the hybrid IC substrate 12, enabling to insure the reliability of the circuit connection.

Furthermore, because the aluminum wire 17 is employed for the electrical connection of the connecting terminal 16 with the hybrid IC substrate 12, a thermal stress will be absorbed by the aluminum wire 17 if produced by a difference in thermal expansion coefficient between the relay member 15 and the hybrid IC substrate 12; that is, the device can be so constructed as to have a substantial strength against the thermal stress.

Next, another embodiment of the present invention will be explained by referring to FIGS. 5 to 18.

First, the constitution of the ignition device for an internal-combustion engine of the present invention will be explained by referring to FIGS. 5 to 8.

In FIG. 5 is shown the outside appearance of the ignition device 1 for an internal-combustion engine of the present embodiment (hereinafter referred to as the ignition device).

The ignition device 1 in FIG. 5 is an example of an ignition device of a simultaneous ignition system. FIG. 5 (a) is a front view of the ignition device 1; FIG. 5 (b) is a side view of the ignition device 1 as viewed in the direction of B in FIG. 5 (a); and FIG. 5 (c) is a plan view of the ignition device 1 as viewed in the direction of C in FIG. 5 (a). The ignition device 1 has a core 25, a connector 26, and a high-voltage tower 27, each of which is housed in an outer case 28. An ignition module 38 is built in a mounting section 29 provided on the side surface of the outer case 28. In FIG. 5, however, the primary coil winding and the secondary coil winding are not illustrated. This ignition device 1 is connected by the connector 26 to an exterior power source, the ground, a driving signal, etc., so that the high voltage may be outputted by the high-voltage tower 27. Also, the ignition device 1 in FIG. 5, being of the simultaneous ignition system, has a couple of high-voltage towers 27.

FIG. 6 is a sectional view showing the mounting section 15 and its vicinity of FIG. 5 (a). In FIG. 6, the ignition module 38 is provided with a heat sink 39, a control circuit (IC) 46 jointed on the heat sink 39, and a power transistor 47, and the control circuit (IC) 46 and the power transistor 47 are connected by a wire of an aluminum system 48 (hereinafter referred to as the aluminum wire). As the control circuit 46, a circuit with terminals incorporated into a mold by insert-molding or pressing or a ceramic substrate on which a circuit is formed by thick-film baking is usable. According to this constitution, the heat sink 39 is disposed in the outermost part of the ignition module 38 and exposed outside, and the power transistor 47 which is a heat source is disposed inside the heat sink 39, that is, on the primary coil winding 36 and secondary coil winding 37 side, whereby the contact of the heat sink 39 with the primary coil winding 36 and the secondary coil winding 37 which are heat sources, and the core 25, can be prevented, thus separating the power transistor 47 which is a heat source, from the primary coil winding 36 and the secondary coil winding 37 as much as possible. Therefore the effect of heat on the heat sink 39 is decreased, thereby enabling efficient heat dissipation.

Figure 8:
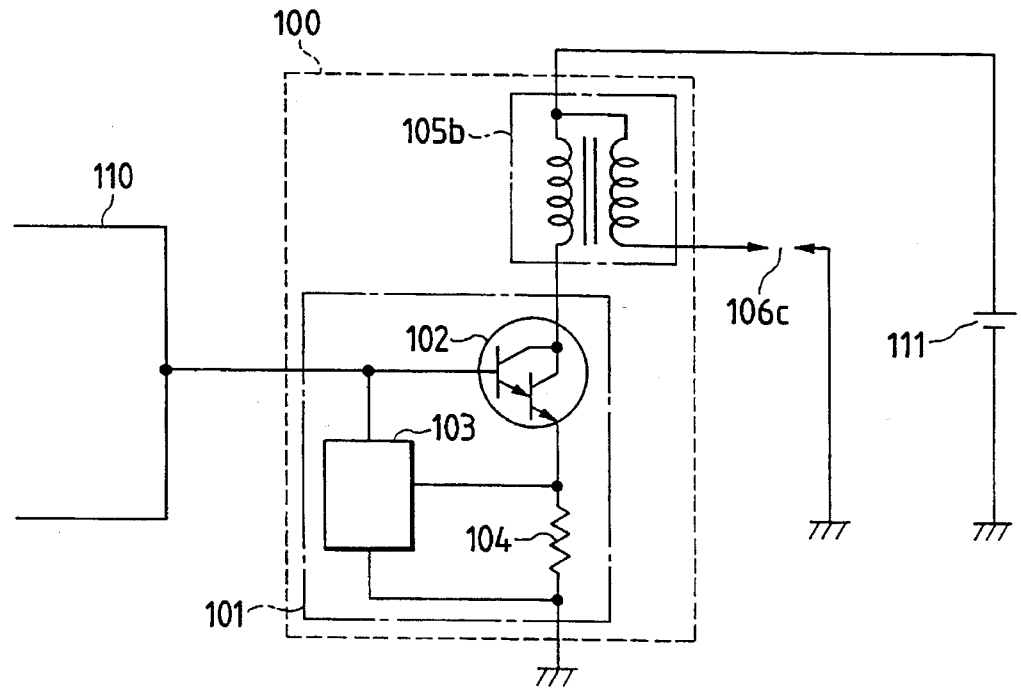
FIG. 8 is a block diagram of the basic electronic distribution system for general use for the ignition device for an internal-combustion engine of FIG. 5, and particularly a block diagram of an electronic distribution system of an independent ignition for internal-combustion engine.

FIGS. 7 and 8 show a basic system constitution generally used in the ignition device for an internal-combustion engine as described above. However, FIG. 7 shows the basic system constitution for the simultaneous ignition system and FIG. 8 for the independent ignition system. In these drawings like members are designated by like reference numerals.

In the simultaneous ignition system of FIG. 7, the ignition module 101 comprises the power transistor 102, the primary current limit circuit 103, and the primary current detecting resistor 104; this ignition module 101 is integrally assembled with the ignition coil 105a which consists of the primary coil winding and the secondary coil winding, constituting the ignition device 100. Then, the power transistor 102 is operated on and off by an input signal fed from the control unit 110, thus supplying and interrupting the current on the primary side of the ignition coil 105a and accordingly inducing a high voltage on the secondary side of the ignition coil 105a to thereby let a spark jump between electrodes of the spark plugs 106a and 106b. A battery 111 functions to supply the electricity to the circuit. In the independent ignition system of FIG. 8 also, the basic operation is the same as that shown in FIG. 7; in this case, however, the current is supplied from one ignition coil 105b, making the spark jump between the electrodes of one spark plug 106c connected to the secondary side thereof.

Next, there will be explained the wind for efficiently cooling the above-described ignition module of the ignition device and the effective arrangement of the ignition device for producing the wind with reference to FIGS. 9 to 14.

Figure 9:
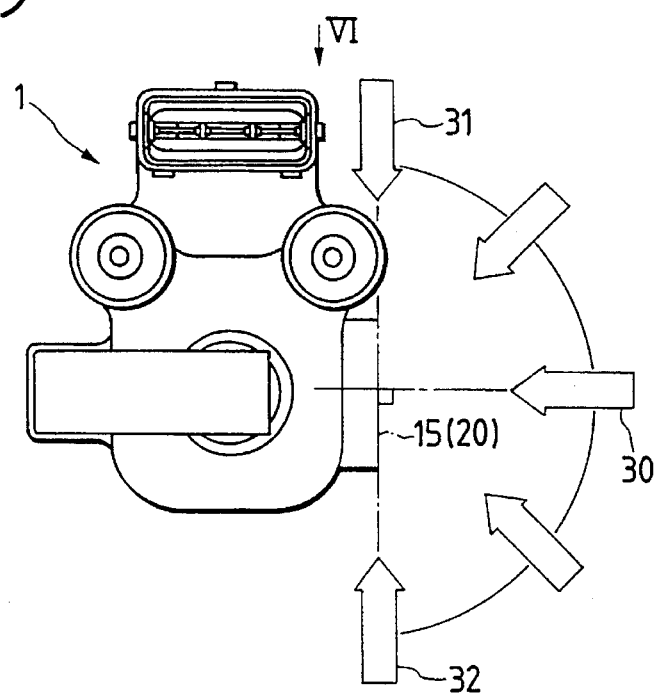
FIG. 9 is a front view of the ignition device for an internal-combustion engine showing directions of wind which is effective for cooling the ignition module.
Figure 10:
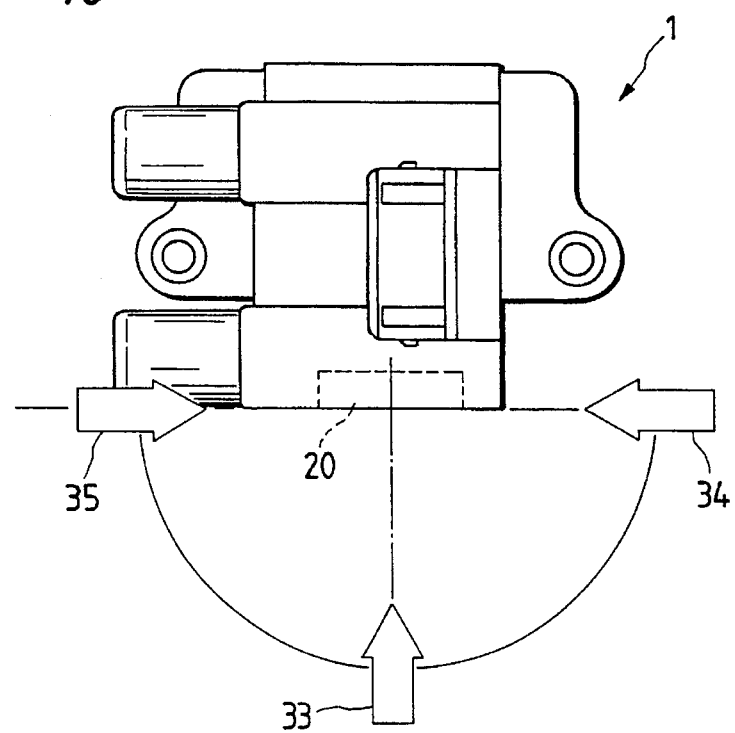
FIG. 10 is a plan view taken in the direction of VI of FIG. 9, showing the direction of wind which is effective for cooling the ignition module.

FIGS. 9 and 10 show the effective direction of the wind for cooling the ignition module 38. FIG. 9 is a front view of the ignition device 1, while FIG. 10 is a plan view as viewed in the direction of VI of FIG. 5. In FIGS. 9 and 10, the appropriate direction of the wind to be applied to the ignition module 38 built in the mounting section 15 and accordingly to the heat sink 39, ranges from the time indicated by the direction of the arrow 31 or 34 in the drawing to the time indicated by the direction of the arrow 32 or 35 in the drawing, that is, ±90°, on the basis of the time when the wind blows perpendicularly to the direction of movement of the vehicle as the arrow 30 or 33 in the drawing. When within this range, the heat from the power transistor 47 which is the heat source of the ignition module 38 can be efficiently dissipated. Also, the most efficient wind direction is as indicated by the arrow 30 or 33 in the drawing.

Figure 11:
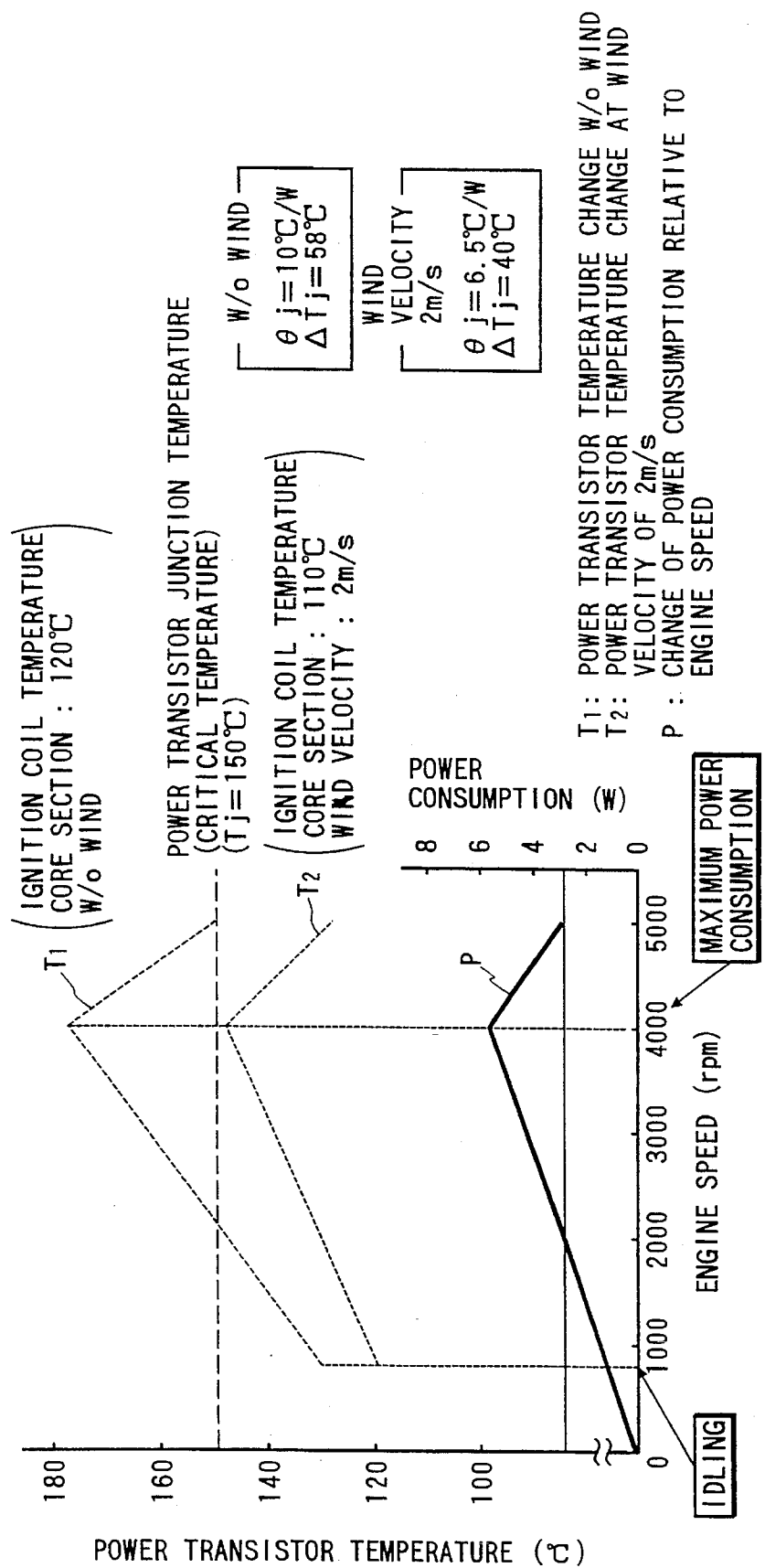
FIG. 11 is a graph showing one example of a relationship between power consumption P relative to the engine speed and the temperature of a power transistor.

FIG. 11 shows one example of a relationship between the power consumption P relative to the engine speed and the temperature of the power transistor 47. In this drawing, $T_1$ is the temperature of the power transistor 47 when no wind is applied to the heat sink 39, and $T_2$ is the temperature of the power transistor 47 when the wind is applied at the velocity of 2 m/s, and the value of the power consumption P of the ignition module 38 relative to the engine speed becomes a value shown in FIG. 11. At this time the junction temperature (limit temperature) of the power transistor 47 is 150° C.; generally the power transistor 47 must be used in such a manner that the power transistor temperature will not exceed the junction temperature.

In a windless condition, that is, when only heat dissipation from the heat sink 39 into the air is utilized, if the engine speed exceeds 2000 rpm, the temperature $T_1$ will rise over the junction temperature (150° C.) due to the overheating of the power transistor 47. In the meantime, if the 2 m/s wind hits against the heat sink 39 at an angle within the range shown in FIGS. 9 and 10, the temperature $T_2$ of the power transistor 47 lowers below the junction temperature (150° C.) even when the power consumption P is at the maximum value (at the engine speed of 4000 rpm). It is therefore possible to efficiently cool the ignition module 38 by properly selecting the angle and strength of wind to be applied to the heat sink 39. In FIG. 11, $\theta_j$ is the value of temperature rise of the power transistor 47 per unit power consumption, and $T_j$ expresses the value of temperature rise of the ignition module 38.

Figure 12:
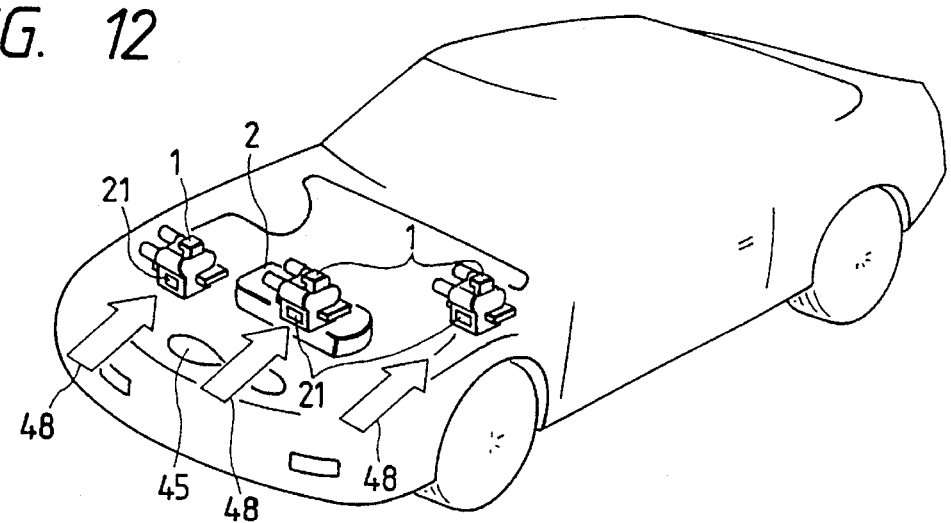
FIG. 12 is a view showing an example of mounting position and direction of the ignition device for an internal-combustion engine in an engine compartment of a motor vehicle, and a location where the wind vertically hits against the surface of the heat sink.
Figure 13:
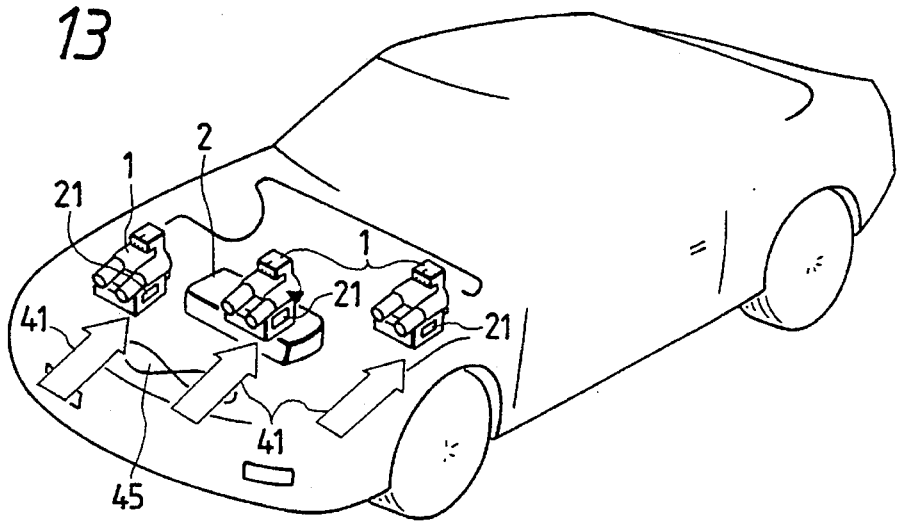
FIG. 13 is a view showing one example of the mounting position and direction of the ignition device for an internal-combustion engine in the engine compartment of a motor vehicle, and a location where the wind hits nearly parallelly against the surface of the heat sink.
Figure 14:
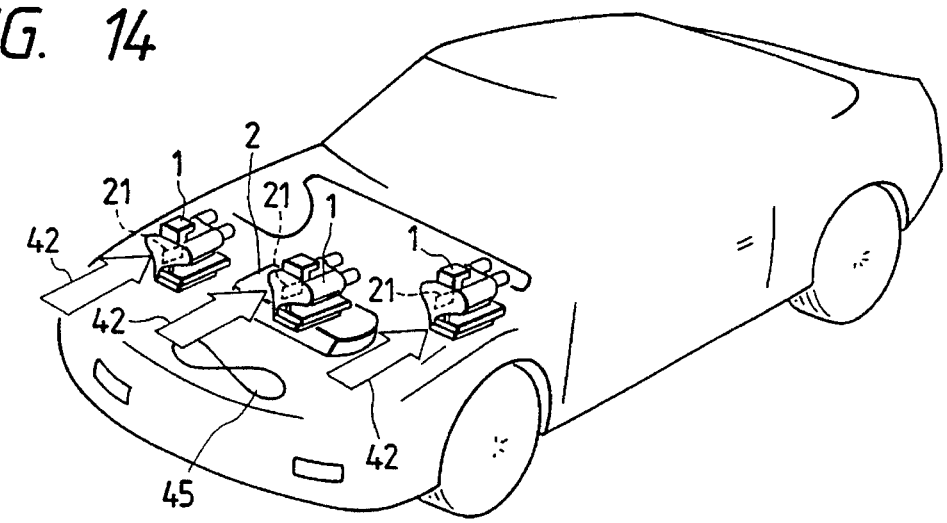
FIG. 14 is a view showing one example of the mounting position and direction of the ignition device for an internal-combustion engine in the engine compartment of a motor vehicle, and a location where the wind hits horizontally against the surface of the heat sink.

FIGS. 12 to 14 show an example of a preferable mounting position and direction of the ignition device 1 in the engine compartment of a vehicle model. FIG. 12 shows the directions of wind produced during travel of the vehicle in which the wind hits perpendicularly against the surface of the heat sink 39 of the ignition module 38 as indicated by the arrow 48. The mounting position may be either near the engine 2 or on both sides thereof. FIGS. 13 and 14 show the directions of wind produced during travel of the vehicle in which the wind hits nearly horizontally against the surface of the heat sink 39 of the ignition module 38 as indicated by the arrow 41 or 42. In this case, also, the mounting position may be either near the engine 2 or on both sides thereof.

In the above-described constitution, generally at the engine speed (near 4000 rpm) with the power consumption of the ignition module at a peak value, the vehicle speed becomes 60 km/h to 100 km/h. At this time, it is expected that the wind enters the engine compartment at the velocity of at least about 4 m/s. This signifies that there can be generated wind flowing at a substantially higher velocity than the example of the wind velocity of 2 m/s shown in FIG. 7 even during ordinary operation of the vehicle. The range of working temperature of the ignition module can be widened by taking into consideration the effect of heat dissipation from the ignition module by the wind generated during the travel of the vehicle. In this case it is necessary to add such conditions as the power consumption of the ignition module and ignition coil and temperatures at the mounting section and its vicinity.

When the vehicle is at a stop, the wind described above will not occur. Further providing the fan 45 can generate wind artificially and forcing the wind at the same angle as stated above against the heat sink 39, thereby enabling to efficiently cool the ignition module 38 as described above.

Figure 15:
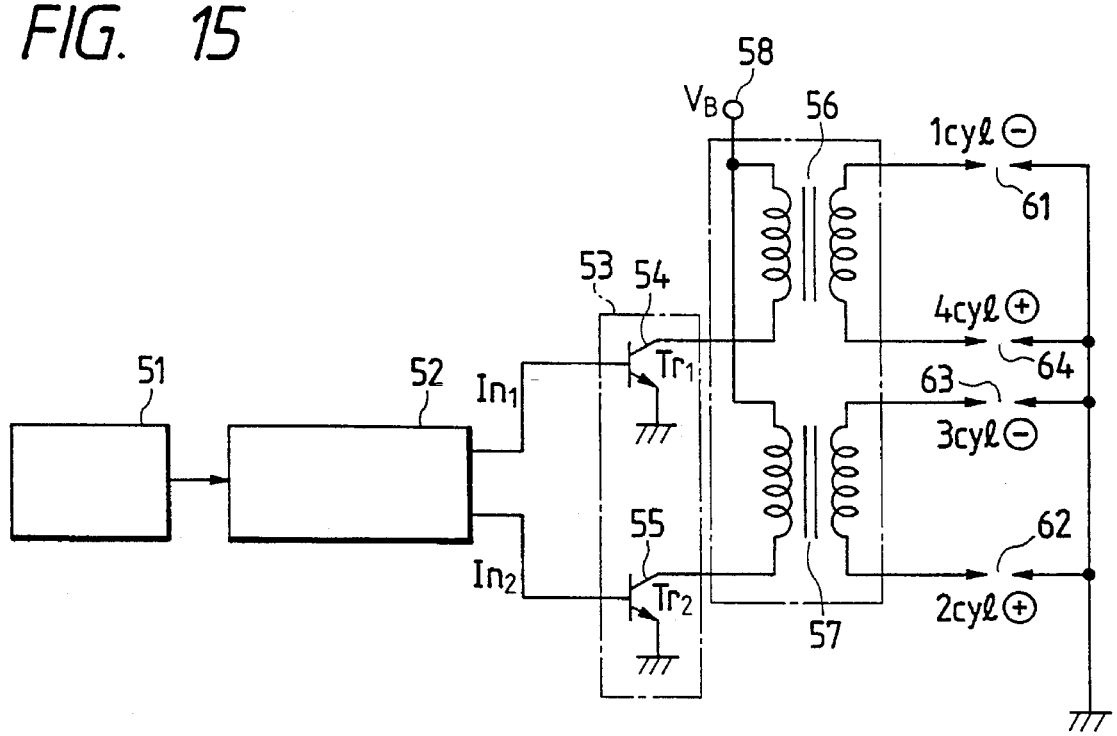
FIG. 15 is a block diagram of an electronic distribution system for the ignition device for an internal-combustion engine, showing one example of the constitution of the electronic distribution system used for the ignition device of simultaneous ignition system for the internal-combustion engine.
Figure 16A:
FIG. 16 is a view showing one example of operation timing of an ignition device of simultaneous ignition system for the internal-combustion engine having the constitution of the electronic distribution system as in FIG. 15.
Figure 16B:
Figure 16C:
Figure 16D:
Figure 16E:
Figure 16F:
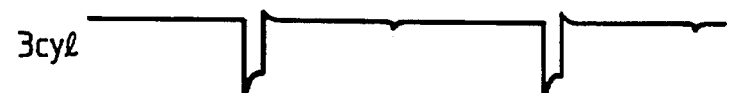
Figure 16G:
Figure 16H:
Figure 17:
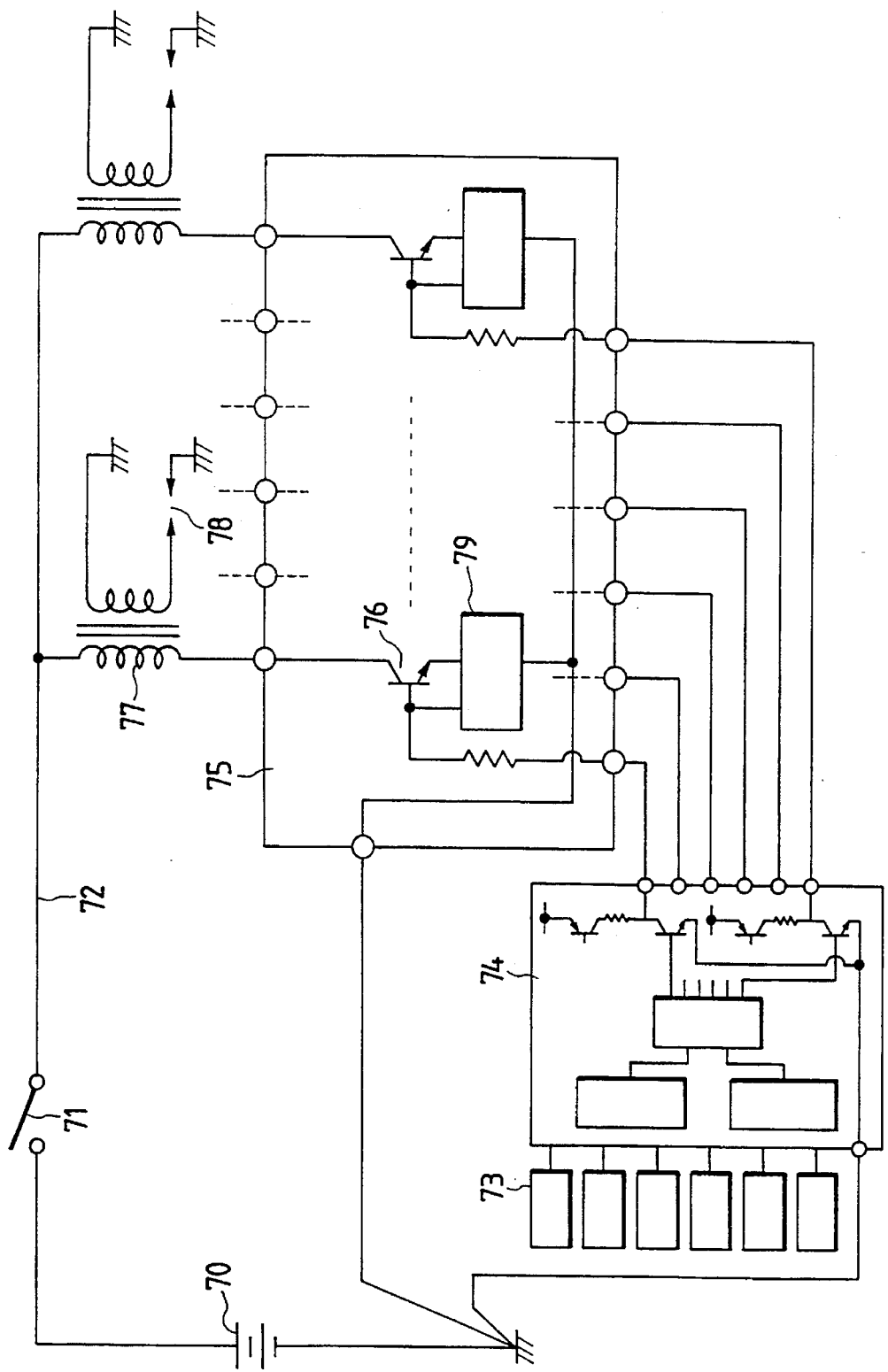
FIG. 17 is a block diagram of the electronic distribution system for the ignition device for an internal-combustion engine, showing one example of the constitution of the electronic distribution system for the ignition device of independent ignition system for the internal-combustion engine.
Figure 18:
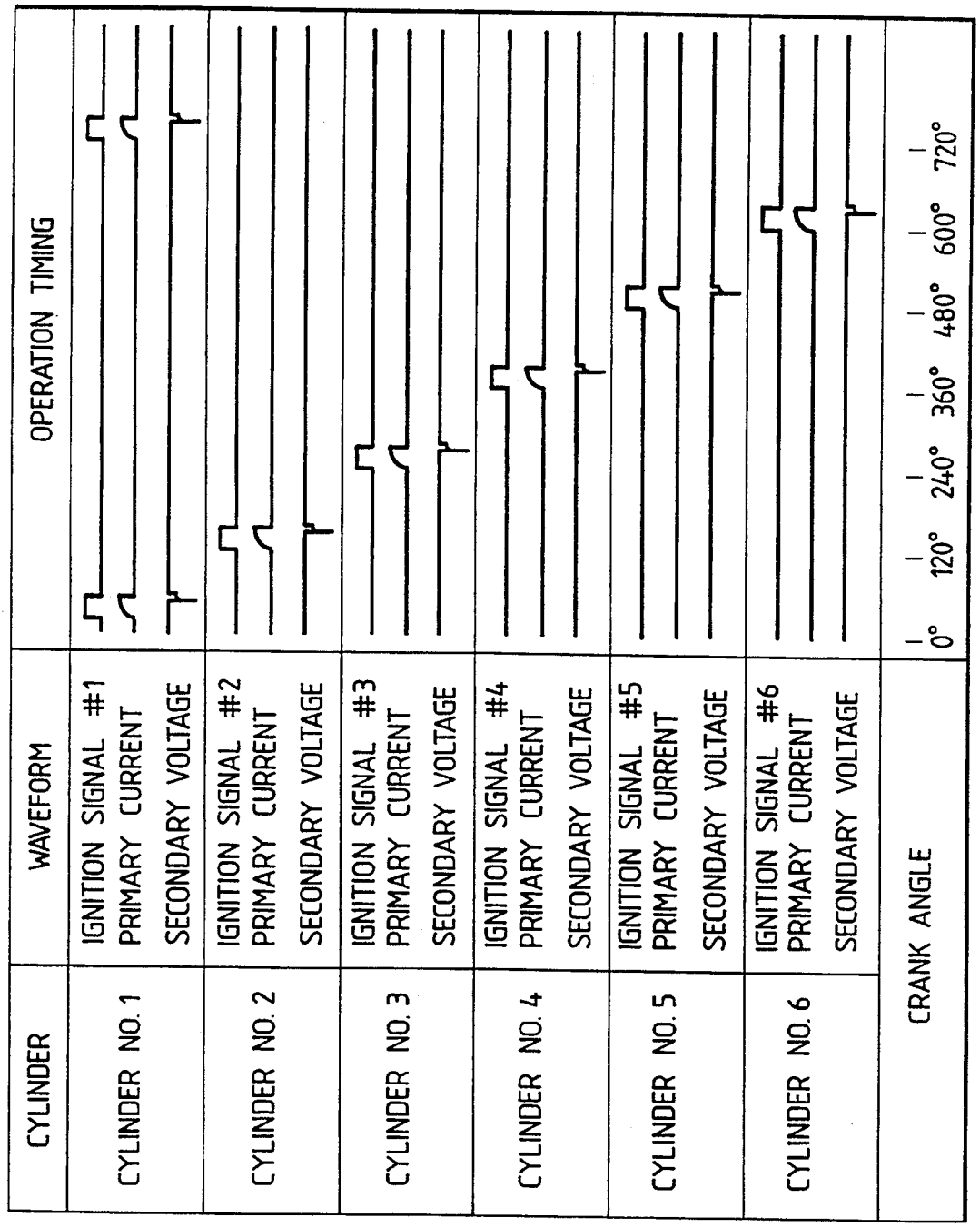
FIG. 18 is a view showing one example of the operation timing of the ignition device of six-cylinder independent ignition system for an internal-combustion engine which has the constitution of the electronic distribution system as shown in FIG. 17.

Next, the constitution of the electronic distribution system of the ignition device of the present embodiment will be explained by referring to FIGS. 15 to 18. FIGS. 15 and 16 are views showing the electronic distribution system for use in the case of the simultaneous ignition system, and FIGS. 17 and 18 are views showing the electronic distribution system for use in the case of the independent ignition system.

First, the electronic distribution system for use in the case of the simultaneous ignition system will be explained. In FIG. 15, an information detected by the sensor 51 is inputted into the engine control unit 52, where various kinds of processes are performed on the information, and inputted as a driving signal having an appropriate ignition timing into the ignition module 53. Thus the power transistors 54 and 55 in the ignition module 53 are driven, to thereby interrupt the current on the primary side of the ignition coils 56 and 57 at a timing corresponding to the ignition signal to induce a high voltage on the secondary side of the ignition coils 56 and 57, thus discharging the electricity from the spark plugs 61 to 64. The voltage terminal 58 functions to supply the power at a voltage $V_B$ to the ignition circuit. As the power transistors 54 and 55, two transistors connected by Darlington connection as shown in FIGS. 7 and 8 are used in many cases; in FIG. 15, only one transistor is shown for brevity (so with FIG. 17).

In FIG. 16 is shown an example of the operation timing of the ignition device of the simultaneous ignition system having the same electronic distribution system constitution as FIG. 15. As shown in FIG. 10, the primary currents $T_{r1}$ and $T_{r2}$ flowing in the power transistors 54 and 55 are interrupted synchronously by input signals $I_{n1}$ and $I_{n2}$ supplied from the engine control unit 52. In each of the spark plugs 61 to 64 is produced the discharge voltage (the secondary voltage) at $1_{cyl}$ to $4_{cyl}$ in the drawing. In this system one ignition coil and one power transistor are used for discharging the electricity at two spark plugs; therefore, for example in the case of the spark plugs 61 and 64, the electricity (plus spark) is discharged at the discharge voltage $4_{cyl}$ at the spark plug 64 simultaneously with the discharge (minus spark) of the discharge voltage $1_{cyl}$ at the spark plug 61. However, when either one cylinder is during the compression stroke, the other cylinder is during the exhaust stroke, and therefore a spark generated in the other cylinder during the exhaust stroke becomes a waste spark, causing no ignition to occur. The relationship between the spark plug 62 and the spark plug 63 is the same as that between the spark plug 61 and the spark plug 64 stated above.

Subsequently, the electronic distribution system in the case of the independent ignition system will be explained. In FIG. 17, a battery 70 supplies the current to the ignition line 72 by a key switch 71. In the meantime, an information detected by a sensor 73 is inputted into the engine control unit 74, where various processes are performed on the information, and fed to the ignition module 75 as a driving signal having an appropriate ignition timing, to thereby drive a power transistor 76 in the ignition module 75 to interrupt the current on the primary side of an ignition coil 77 at a timing corresponding to the ignition signal, and to induce a high voltage on the secondary side of the ignition coil 77, thus causing a spark to jump at a spark plug 78. A current limit circuit 79 functions to limit the current value so that no excessive current will flow to the circuit.

FIG. 18 shows one example of the operation timing of the ignition device of a six-cylinder independent ignition system having the electronic distribution system constitution as shown in FIG. 17. Ignition signals #1 to #6 are successively fed to the ignition modules of the cylinders No. 1 to No. 6 respectively according to the crank angles 0°, 120°, 240°, 360°, 480°, 600°, . . . as shown in FIG. 16, thus flowing the primary current and outputting the secondary voltage. At the crank angle 720° and after, the operation is effected at the same timing as described above.

According to the second embodiment heretofore explained, the mounting position and direction of the ignition device 1 in the engine compartment of a motor vehicle are defined, so that the wind produced during the travel of the vehicle hits on the surface of the heat sink 39 within the range of ±90° from the position perpendicularly facing the direction of movement of the motor vehicle. It is therefore possible to efficiently dissipate the heat from the control circuit 22, the power transistor 47, and accordingly from the ignition module 38.

Furthermore, the wind is artificially produced by the use of a fan 45; the wind being forced against the heat sink 39 at the same angle as described above. Therefore, it is possible to efficiently cool the ignition module 38 even when the vehicle is at a stop.

Furthermore, since it is unnecessary to dissipate the heat of the heat sink 39 to other members by utilizing heat transfer, no special construction for heat dissipation is needed. That is, a low-cost and yet high-reliability ignition device of simple construction with a built-in type ignition module for internal-combustion engines can be provided.

Next, other embodiments of the present invention will be explained by referring to FIGS. 19 and 20. These embodiments are embodiments associated with the constitution of the ignition module and an assembling method thereof. In FIGS. 19 and 20 like members are designated by like reference numerals.

In the third embodiment shown in FIG. 19 (a) and (b), an ignition module 80 is built in a mounting section 96 on the side of an outer case 95. The ignition module 80 has a control circuit 81, a power transistor 82, a heat sink 83, a relay member 84, a connecting terminal 85, an aluminum wire 86, etc.

After each part of the ignition module 80 is mounted in the mounting section 96, a silicone gel 87 is filled and set under a vacuum condition. Thereafter, a connecting pin 97 which is a terminal led out in advance from a coil is inserted into the connecting terminal 85 fitted with the relay member 84, thereby connecting the connecting terminal 85 to the connecting pin 97. This insertion-type connection for connecting the connecting pin 97 to the connecting terminal 85 greatly improves operation efficiency. After connection of the connecting pin 97 to the connecting terminal 85, electrical connection is done by soldering, and further an insulating casting resin 88 is filled in.

In the ignition module 80 of FIG. 19, the heat sink 83 is exposed outside. That is, the heat sink 83 exposed outside not only improves heat dissipation but is utilized itself as the cover of the mounting section 96. Furthermore, an epoxy adhesive 89 is applied from outside in between the outer periphery of the heat sink 83 and the mounting section 96, thereby securing the heat sink 83 and accordingly the ignition module 80, so that the adhered condition can easily be ascertained from outside.

In the above-described embodiment, after each component of the ignition module 80 is arranged in the mounting section 96 of the outer case 95, the epoxy adhesive 89 is applied from outside into a gap between the outer periphery of the heat sink 83 and the mounting section 96, thereby enabling to reliably hold the ignition module 80 while securing the exposed surface area of the heat sink 83 to a maximum extent and improving assembling operation efficiency, and moreover enabling to insure the airtightness of the ignition module 80.

Furthermore, because the silicone gel 87 is filled in the ignition module 80, the ignition module 80 is provided with substantial airtightness and improved vibration resistance. Besides, each part of the ignition module 80 can be protected also from the insulating casting resin 8.

Furthermore, because the connecting terminal 85 fitted with the relay member 84 and the connecting pin 97 which is a terminal led out from the coil are connected by the insertion-type connecting method, greatly improved operation efficiency is insured.

In the fourth embodiment shown in FIG. 20 (*a*) and (*b*), unlike the third embodiment described above, the mounting section 96*a* on the side surface of the outer case 95*a* is not of a projected shape as in FIG. 19, while the heat sink 83 has a projected shape. In this case also, the epoxy adhesive 89 is applied in a gap between the mounting section 96*a* and the heat sink 83*a*.

In the above-described other embodiments, a shield plate may be provided between the ignition module and the ignition coil to protect the ignition module from the effect of heat of the ignition coil; heat dissipating fins may be provided on the surface of the heat sink for efficient heat dissipation from the ignition module; and further an air duct may be provided to efficiently apply the wind to the heat sink surface.

Furthermore, the effect of the heat dissipation and cooling of the ignition module by the wind explained above are effective also where the heat sink is built in the ignition device and not exposed out of the outermost surface.

According to the present invention, because the wind produced during the travel of the motor vehicle hits against the surface of the heat sink exposed out of the outermost surface of the ignition module, it is possible to improve the efficiency of heat dissipation from the control circuit section and accordingly from the ignition module.

Furthermore, since the wind is artificially produced by the use of a fan means and forced against the heat sink, the ignition module can be cooled efficiently even when the vehicle is at a stop.

Furthermore, since the epoxy adhesive is applied from outside between the outer periphery of the heat sink and the outer case after the mounting of each component of the ignition module in the outer case, it is possible to firmly secure the ignition module while insuring the maximum exposed surface area of the heat sink and improving the assembling work efficiency, and in addition insuring the airtightness of the ignition module.

Furthermore, filling the silicone gel agent in the ignition module insures the airtightness of the ignition module and improves vibration resistance. Moreover, each component of the ignition module can be protected from the insulating casting resin.

Furthermore, according to the present invention, because it is unnecessary to dissipate the heat of the heat sink by heat transfer to other members, no special structure for heat dissipation is needed, thereby enabling the provision of a low-cost, high-reliability ignition device of simple construction with a built-in ignition module for internal-combustion engines.

What is claimed is:

1. An ignition device for an internal-combustion engine in which an ignition module provided with an IC section for interrupting the primary current of an ignition coil is assembled integrally with said ignition coil;

said ignition module having a heat sink for dissipating heat produced at said IC section, a relay member secured on said heat sink, a connecting terminal fitted on said relay member and electrically connected with an internal terminal of said ignition coil, and a wire for electrical connection between said connecting terminal and said IC section.

2. An ignition device for an internal-combustion engine according to claim 1, wherein said ignition module is built in a pocket section provided in a case for holding said ignition coil; a silicone gel agent is filled in a space on said IC section side of said relay member in said pocket section; and an insulating casting resin for insulating said ignition coil is filled in a remaining space of said pocket.

3. An ignition device for an internal-combustion engine according to claim 1, wherein said wire for electrical connection between said connecting terminal and said IC section is an aluminum bonding wire.

4. An ignition device for an internal-combustion engine according to claim 1, wherein a material of said relay member is a thermosetting synthetic resin.

5. An ignition device for an internal-combustion engine in which an ignition module including a control circuit section for interrupting the primary current of an ignition coil and a heat sink for dissipating heat produced at said control circuit section is assembled integrally with said ignition coil; said heat sink is so arranged as to be exposed out of the outermost surface of said ignition module; and said control circuit section is mounted on the surface of said heat sink on said ignition coil side;

said ignition device for an internal-combustion engine being mounted within an engine compartment of a motor vehicle so that the wind produced during travel of said motor vehicle will hit against the surface of said heat sink exposed out of said outermost surface of said ignition module.

6. An ignition device for an internal-combustion engine according to claim 2, wherein the surface of said heat sink is set at an angle within the range of ±90° from a position in which said heat sink perpendicularly faces the direction of movement of said motor vehicle.

7. An ignition device for an internal-combustion engine according to claim 2, further having a fan means for producing the wind at least when said motor vehicle is at a stop; said fan means being mounted so that said wind will hit against the surface of said heat sink exposed out of said outermost surface of said ignition module.

* * * * *